(12) United States Patent
Saia et al.

(10) Patent No.: US 6,475,877 B1
(45) Date of Patent: Nov. 5, 2002

(54) METHOD FOR ALIGNING DIE TO INTERCONNECT METAL ON FLEX SUBSTRATE

(75) Inventors: Richard Joseph Saia, Niskayuna; Kevin Matthew Durocher, Waterford; James Wilson Rose, Guilderland; Leonard Richard Douglas, Burnt Hills, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/469,749

(22) Filed: Dec. 22, 1999

(51) Int. Cl.[7] .............................................. H01L 21/301
(52) U.S. Cl. ........................ 438/460; 438/106; 438/461
(58) Field of Search ................................ 438/106, 107, 438/118, 125, 598, 460; 257/723–725, 772–775

(56) References Cited

U.S. PATENT DOCUMENTS

| | | |
|---|---|---|
| 4,783,695 A | 11/1988 | Eichelberger et al. |
| 4,835,704 A | 5/1989 | Eichelberger et al. |
| 4,933,042 A | 6/1990 | Eichelberger et al. |
| 5,527,741 A * | 6/1996 | Cole et al. ................. 438/107 |
| 5,870,822 A * | 2/1999 | Darke et al. ................. 29/840 |
| 6,242,282 B1 * | 6/2001 | Fillion et al. ................. 438/106 |
| 6,271,469 B1 * | 8/2001 | Ma et al. ................. 174/52.4 |
| 6,284,564 B1 | 9/2001 | Balch et al. |

* cited by examiner

*Primary Examiner*—Hoai Ho
*Assistant Examiner*—Dung Anh Le

(57) ABSTRACT

A method and process sequence for accurately aligning (die to interconnect metal on flex substrate such as polyimide flex is described. A mask for via formation is first patterned in a metal layer on the bottom surface of the flex substrate. Die attach means such as die attach adhesive is then applied to the top side of flex substrate. The bond pads on die are locally, adaptively aligned to the patterned metal via mask on the flex with high accuracy. Vias down to the die bond pads are then created by either plasma etching or excimer laser ablation through the existing aligned metal mask on the flex substrate, and interconnect metal is then deposited, patterned and etched. As a result of this process, the flex metal interconnect artwork does not have to be customized for each die misplacement using "adaptive lithography". Lower cost commercially available lithography equipment can be used for processing, reducing capital equipment and processing cost. The method is compatible with the projected designs of the next generation die which will have bond pads on the order of 40 um in size.

11 Claims, 4 Drawing Sheets

METHOD FOR ALIGNING DIE TO INTERCONNECT METAL ON FLEX SUBSTRATE

FIELD OF THE INVENTION

This invention relates generally to the field of die placement, and in particular, to improving accuracy during placement of die onto a flex substrate such as polyimide flex.

BACKGROUND OF THE INVENTION

The technique of adaptive lithography for die placement involves measuring the misalignment of specified preexisting features (e.g. die bond pads or fiducial marks on prior metal layers), and modifying the routing of metal lines and vias to correspond to these misalignments. If one were using conventional lithography tools, this would be analogous to fabricating a custom mask for each layer of artwork exposed on each unique part. The employment of a virtual mask (i.e., a mask which is written directly from computer memory onto the parts), and the automated customization of the artwork, prevents this from being cost-prohibitive.

Yet, there are still drawbacks to this approach. It is capital-intensive, requiring custom equipment for automating the customization of the interconnect artwork to accommodate misalignment of die and distortion of prior layers of routing. It is also computationally intensive, as design rules for minimum line width and pitch must be followed while rerouting lines, and each artwork is unique to the part it represents. Finally, and most importantly, as currently practiced this procedure remains highly labor intensive. The precise measurement of misregistration of each die, and of the distortion of flexible substrates has not been fully automated. Techniques have been developed to generalize flex distortion and reduce the number of measurements, and custom "Component Mapping Systems" (CMS) can be used to reduce the number of man-hours required to acquire the data needed to accurately customize artwork for each unique part. But a significant amount of operator involvement is still required for setup, discretion (to supplement / override the automated vision system of the CMS), and tracking to ensure that the correct artwork is exposed on each corresponding part.

In one form of high density interconnect (HDI) circuit module, an adhesive coated polymer film overlay is applied over a substrate which can support integrated circuit chips in chip wells. Via openings are then formed to expose chip pads of the integrated circuit chips. The polymer film provides an insulated layer upon which is deposited a metallization pattern for interconnection of substrate metallization and/or individual circuit chips through the vias. Methods for performing an HDI process using overlays are further described in Eichelberger et al., U.S. Pat. No. 4,783,695, and in Eichelberger et al., U.S. Pat. No. 4,933,042. Generally a plurality of polymer film overlays and metallization patterns are used.

In another form of circuit module fabrication (referred to herein as chip-on-flex), as described by commonly assigned Cole et al., U.S. Pat. No. 5,527,741, a method for fabricating a circuit module includes using a flexible interconnect layer having a metallized base insulative layer and an outer insulative layer. At least one circuit chip having chip pads is attached to the base insulative layer and vias are formed in the outer and base insulative layers to expose selected portions of the base insulative layer metallization and the chip pads. A substrate can be molded around the attached chip or chips. A patterned outer metallization layer is applied over the outer insulative layer extending through selected ones of the vias to interconnect selected ones of the chip pads and selected portions of the base insulative layer metallization.

In the standard chip-on-flex processes such as disclosed in aforementioned Cole et al., U.S. Pat. No. 5,527,741, the die are placed on flex substrate such as polyimide flex by interpolative alignment to "global" fiducials patterned in metal which are typically located at the outer extents of the module layout. The accuracy of die placement within $25\mu$ of target has a $Z_{st}$ of 1.79 σ (see FIG. 6), wherein $Z_{st}$ is defined as the "short term sigma." $Z_{st}$ is a statistical measure of how often defects (i.e. die misplacements in this case) are likely to occur. The higher the sigma value, the less likely a process will produce defects. As a result of this, alignment of the flex metal interconnect through vias to the die bond pads is generally accomplished with the use of "adaptive lithography" such as described in Eichelberger et al., U.S. Pat. No. 4,835,704. Adaptive lithography is a method which can accommodate die placement errors by creating "custom" direct write artwork for the position of laser drilled vias and the subsequent interconnect metal patterning. Although this process works well, it requires custom built equipment which is expensive and relatively difficult to maintain. It also requires a very large data file to store unique artwork for each module processed. The resulting "adaptive" artwork also limits the design rules of the interconnect layout near die. This becomes increasingly more important as the size of die and die bond pads shrink. It is estimated that by the year 2007, the die bond pad size will shrink to $40\mu$ on a $55\mu$ pitch. Interconnect routing using adaptive lithography will become very difficult. E. W. Balch et al., "HDI Chip Attachment Method for Reduced Processing," application Ser. No. 09/399,461, filed Sep. 20, 1999, discloses a process in which vias are pre-drilled through flex substrate coated with adhesive. The die are then aligned to the pre-drilled vias, and placed in the adhesive. This method depends heavily on the flow properties of the die attach adhesive. To provide void-free attachments, the optimum die attach adhesives for chip-on-flex flow during curing. With this method, adhesive also flows into the pre-drilled vias during the cure process, and can not be removed. If the via is not open, contact to the die bond pad can not be made. The pre-drilled vias in polyimide are also not an optimum structure for die placement alignment.

Further, avoiding sharp via corners is typically advantageous to improve reliability, reduce stress, and allow for more efficient interconnect routing designs.

Thus, it is desirable to provide an alternate method of aligning the die to the interconnect metal on the flex using commercially available equipment, while eliminating the use of adaptive lithography and expensive custom equipment. A benefit of this would be the ability to accommodate multi-chip module (MCM) interconnect routing necessary for the next generation die.

It is further desirable to provide a method of forming non-rectangular vias, allowing the via shape, determined by the metal pattern and the etching technique, to be varied. Round vias, for example, may improve reliability because they have no stress points, and may allow for more efficient interconnect routing designs.

It is further desirable to provide the ability to remove dielectric material from the surface of MMIC or MEMS die for improved electrical performance or mechanical function, in large areas, not just small vias.

It is further desirable to enable the formation of vias to bond pads using any of a variety of methods (e.g., RIE (reactive ion etching), plasma etching, excimer ablation).

SUMMARY OF THE INVENTION

Briefly, in accordance with one embodiment of the invention, a method for aligning die to interconnect metal on a flex substrate to produce at least one electronic chip package comprises patterning a mask for via formation in a via mask layer on a bottom surface of said flex substrate; and adaptively aligning at least one bond pad of at least one die to local fiducials of the via mask layer.

As a result of this process, the flex metal artwork does not have to be customized for each die misplacement using "adaptive lithography". Die are placed based on the local details of the interconnected artwork, rather than interconnect artwork being adapted to suit the prior placement of die. Lower cost commercially available lithography equipment can be used for processing, reducing capital equipment and processing cost. The method is compatible with the projected designs of the next generation die which will have bond pads on the order of 40 um in size.

BRIEF DESCRIPTION OF THE DRAWING

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION OF THE INVENTION

Figure 1:
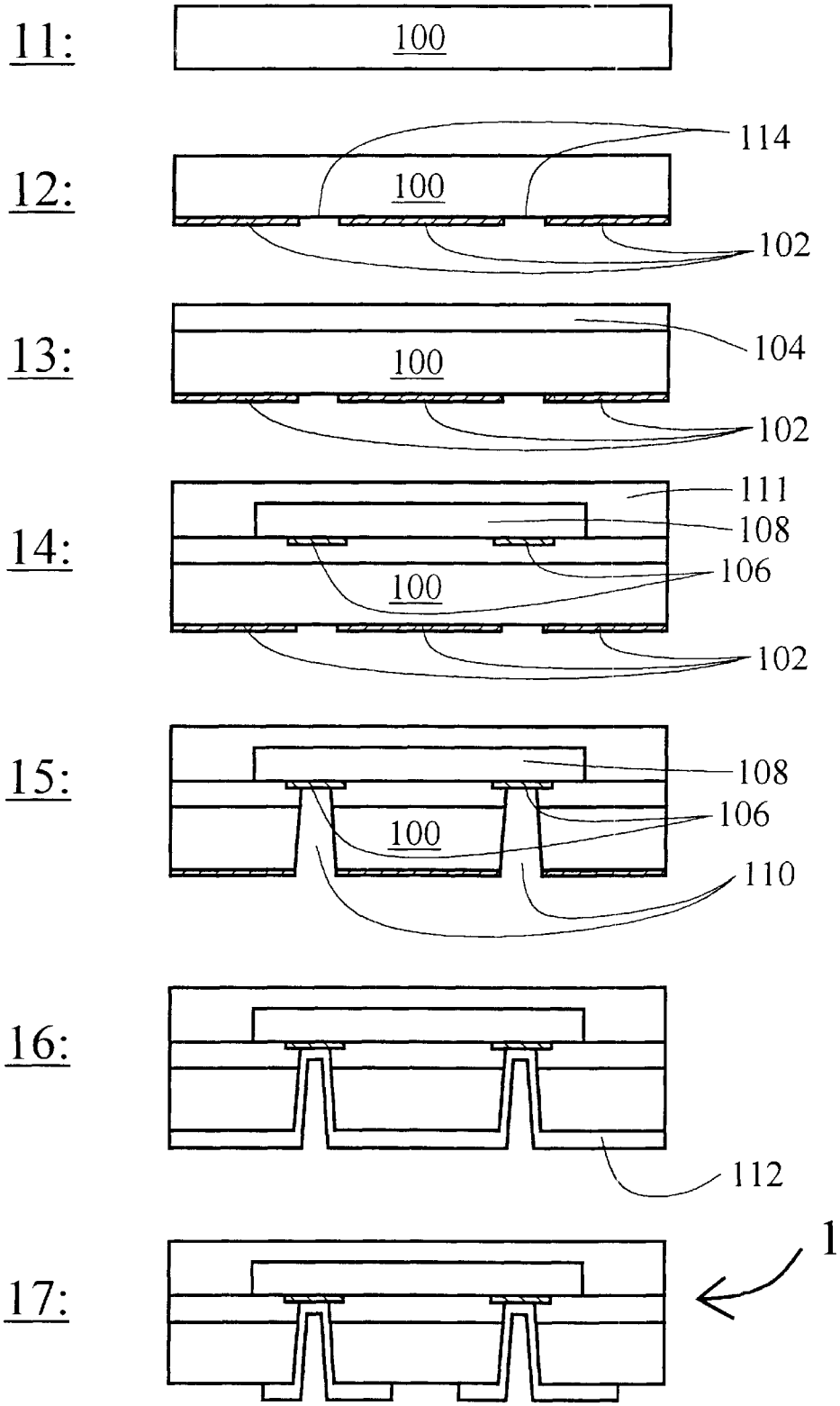
FIG. 1 contains a series of plan views illustrating the steps of the process by which a die is aligned to interconnect metal on a flex substrate according to an embodiment of the invention.

Referring to FIG. 1, which from top to bottom illustrates a die alignment process according to one embodiment of the present invention, starting with a flex substrate 100 such as polyimide flex at step 11, a mask for via formation is first deposited and patterned in a metal via mask layer 102 on the bottom surface of flex substrate 100 (step 12). Importantly, the pattern incorporates local reference features which precisely correspond to features on each die that will be placed on the frame. In particular, local fiducials 114 such as die drop locations are patterned directly into via mask layer 102. Via mask layer 102 does not ever have to be modified using adaptive lithography once die are placed, because the via mask layer is the reference upon which all die placements and interconnect patterns are subsequently based.

Die attach means 104 such as die attach adhesive is then applied to the top side of flex substrate 100 (step 13). Bond pads 106 on die 108 are locally aligned to local fiducials 114 patterned on metal via mask layer 102 and attached (using die attach means, e.g. adhesive 104) to flex substrate 100 with high accuracy, using a novel and inventive "adaptive die placement" apparatus and method (step 14). Adaptive die placement as disclosed herein will be described in greater detail in connection with FIGS. 2 through 5. The modules optionally may be encapsulated by material 111 at this point, for example, in manner similar to that described in aforementioned U.S. Pat. No. 5,527,741.

Vias 110 down to die bond pads 106 are then created (opened) by any of a variety of methods, such as plasma etching or excimer laser ablation, through the existing aligned metal via mask layer 102 on flex substrate 100 (step 15). Indeed, the use of via mask layer 102 for adaptive die placement has the side benefit of enabling a wide range of techniques to be used for via formation.

Finally, interconnect metal 112 is then deposited (step 16), and patterned and etched (step 17). This results in a full chip scale package or multichip module 1 following step 17.

Although the steps in FIG. 1 are all shown as having the same orientation, typically steps 12 and 15–17 are more easily performed by inverting the structure. Additionally, the terms "top" and "bottom" are used for purposes of example only.

FIGS. 2 through 5 illustrate in further detail, the adaptive die placement leading to the configuration of step 14. Generally, there are three primary sources of die placement misalignment. Preparation of the frame for die placement may introduce distortion of the flex substrate 100 on the frame. Variability in placement of the frame within a die attach station may introduce translation and rotation errors for the entire frame. Errors in the calibration or interpolation of robot motion across its working area may result in misplacement of die with respect to fiducials between which the robot motions are interpolated.

Figure 2:
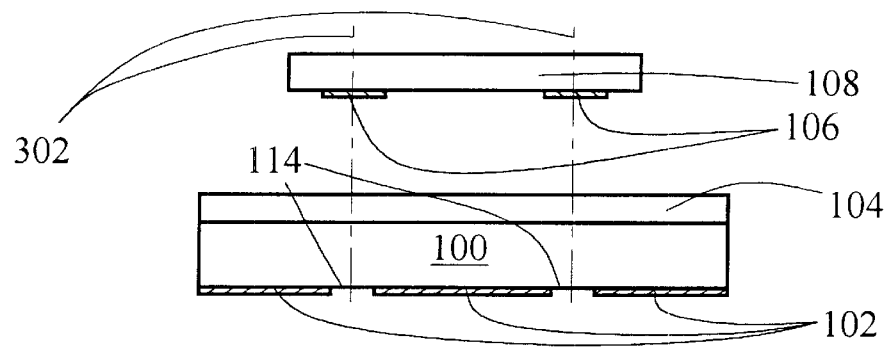
FIG. 2 is a plan view illustrating the desired alignment of a die and its die bond pads to via drop openings patterned in a metal mask layer of a flex substrate.

These errors are accommodated so as to lead to the configuration resulting at step 14, using adaptive die placement. In particular, as shown in FIG. 2, it is desired to achieve a close alignment 302 between a selected pair of die bond pads 106 of die 108 and a corresponding selected pair of local fiducials 114, such as the illustrated via drop openings, patterned directly into via mask layer 102.

To achieve this, die 108 are loaded with the active surface face down. A downward-looking camera focuses on the reference features on a frame. A vision recognition system determines the location of reference features on the frame in a three-tiered hierarchy: "global" fiducials, "module" fiducials, and "local" fiducials. All of these fiducials are created at step 12 as part and parcel of via mask layer 102. Global fiducials are coarse features which enable the system to compensate for gross misalignment or rotation of the entire frame. A first downward-looking camera with low-magnification moves to a pair of standardized coordinates and locates the global fiducials within its field of view. These two global fiducials establish the location and rotation of the frame. A second downward-looking camera with higher magnification, 500, is positioned over the coordinates for each pair of module fiducials. Acquisition of each pair of module fiducials by this higher magnification camera partially corrects for distortion of the flex pattern across the frame. Aside from the fact that these fiducials are created as part of the patterning of via mask layer 102, the two above-described alignment steps are standard prior art practice for fabrication of chip-on-flex modules.

At this point, an additional novel and inventive alignment step takes place. High magnification, downward-looking camera 500 is positioned over the local fiducials 114 of via mask layer 102 for each die to be placed, and the vision system acquires the position of each of these local fiducial 114 features (see FIG. 3). The advantage to this step is that the computed interpolation of the placement point for each die, based on the module fiducials, is superseded by the actual positions of local fiducial 114 features which correspond to the die placement. An example of this would be a field of metal having openings such as via drop openings acting as local fiducials 114 which correspond (302) to the desired placement locations of die bond pads 106 on die 108. Alignment to two or more of these openings allows for more accurate placement of the die than does interpolation from a distant fiducial. Calibration errors, local distortions of the flex film, and other minor error sources are eliminated. The die is then "picked" by a vacuum end effector 610 and brought over an upward-looking camera 600 (see FIG. 4). Upward-looking camera 600 has approximately the same magnification as high magnification, downward-looking camera 500 which acquired the local fiducials. The position of the bond pads 106 on die 108 corresponding to the acquired features of the local fiducials 114 such as the via drop openings on flex substrate 100 are captured. This precisely determines the position and rotational orientation of die 108 and die bond pads 106 relative to vacuum end effector 610. Die 108 is then translated and rotated to match the desired position on flex substrate 100, and pressed against die attach means 104 on flex substrate 100.

Figure 3:
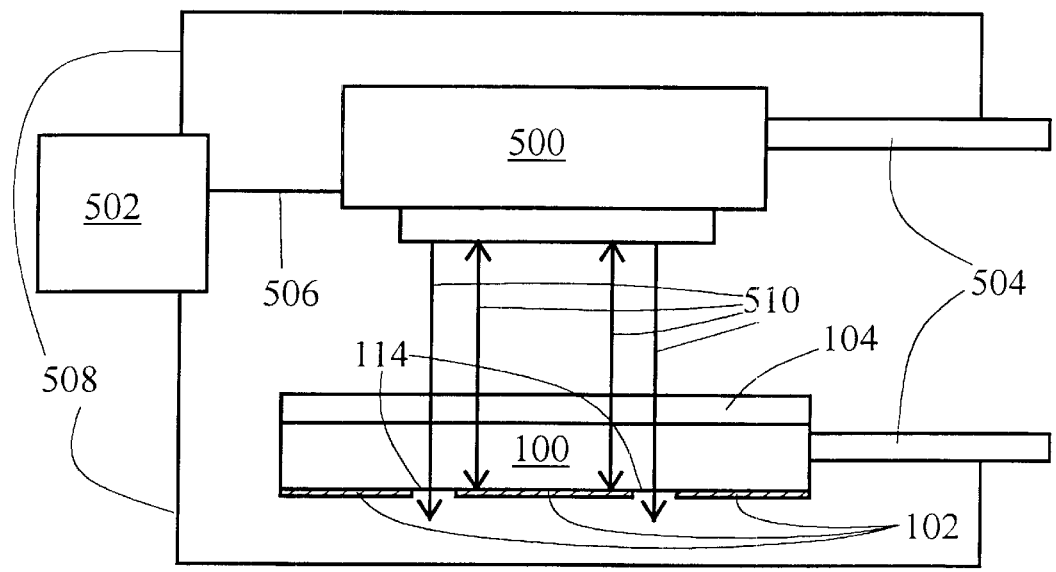
FIG. 3 is a mixed plan and schematic view showing how a downward-looking camera is used to pinpoint via drop openings to which die bond pads are to be aligned.

In particular, as shown in detail in FIG. 3, downward-looking camera 500 emits light 510 from a light source associated therewith, toward and through die attach means 104 and flex substrate 100, each of which is translucent. Light rays which strike the metallic via mask layer 102 are reflected back toward downward-looking camera 500 while those directed toward the local fiducials 114 at the via drop openings pass through flex substrate 100 and are not reflected back, thus enabling downward-looking camera 500 to detect the via drop openings. As illustrated schematically, a control system 502 accepts (506) vision recognition data from downward-looking camera 500, and determines and records precise positions and angular orientations of the via drop openings in the plane normal to light path 510 as marked by local fiducials 114. Again, it is important to emphasize that in a preferred embodiment, local fiducials 114 are the via drop openings, which are directly patterned into metallic via mask layer 102. An actuator 504 for precisely moving and angularly-orienting downward-looking camera 500 and flex substrate 100 relative to one another are controlled (508) by control system 502. Actuator 504 typically employ numerically-controlled robotic motion technologies known in the art. In a preferred embodiment, flex substrate 100 occupies a fixed location, and downward looking camera 500 is moved relative thereto. It is understood, however, that alternative embodiments of the invention may actually move one or both of downward-looking camera 500 and flex substrate 100 on an absolute scale of motion to achieve the desired relative motion therebetween, and that numerous variations to achieve this relative motion would be apparent to someone of ordinary skill and is considered to be within the scope of this disclosure and its associated claims.

Figure 4:
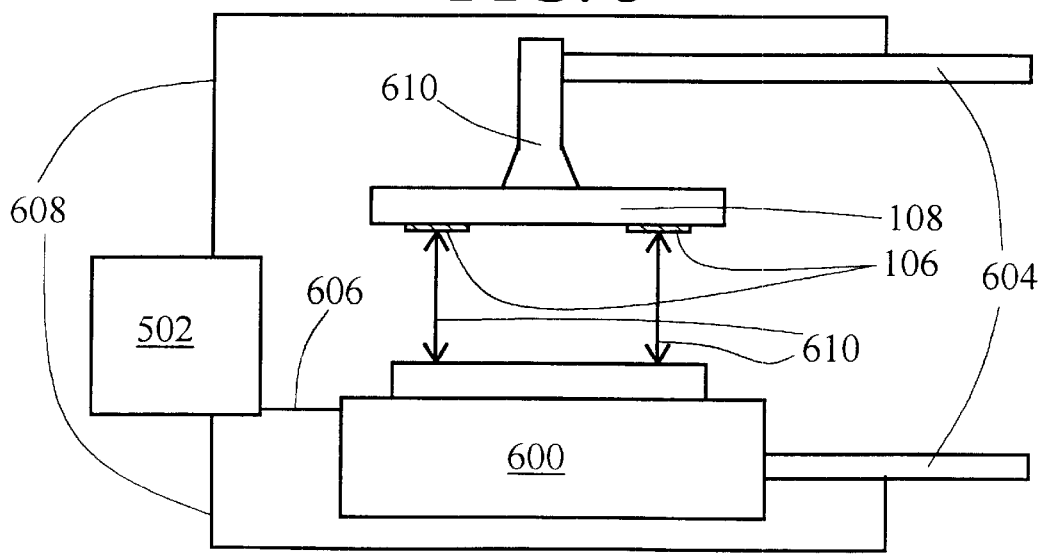
FIG. 4 is a mixed plan and schematic view showing how an upward-looking camera is used to pinpoint the locations of the die bond pads to be aligned with the via drop openings pinpointed in FIG. 3.

At this point, with suitable coordinates identified for via drop openings (local fiducials 114) and recorded in control system 502, it is now known where on flex substrate 100 die bond pads 106—once these are empirically located—should be placed. FIG. 4 illustrates how die bond pads 106 are in fact empirically located, using upward-looking camera 600. Vacuum end effector 610 or a suitable substitute or equivalent picks up die 108 with die bond pads 106. Further actuator 604 for precisely moving and angularly-orienting vacuum end effector 610 and upward looking camera 600 relative to one another are also controlled (608) by control system 502. Further actuator 604 typically employ robotic motion technologies, and the same considerations noted earlier for actuator 504 apply here as well. Upward-looking camera 600 also emits light 610 from a light source associated therewith. Light reflected off of die bond pads 106 is thus used to detect the locations and angular orientations of die bond pads 106 relative to the known location and orientation of vacuum end effector 610. As a result, control system 502 now has all the information needed to precisely align via drop openings (local fiducials 114) with die bond pads 106, see again, FIG. 2.

Figure 5:
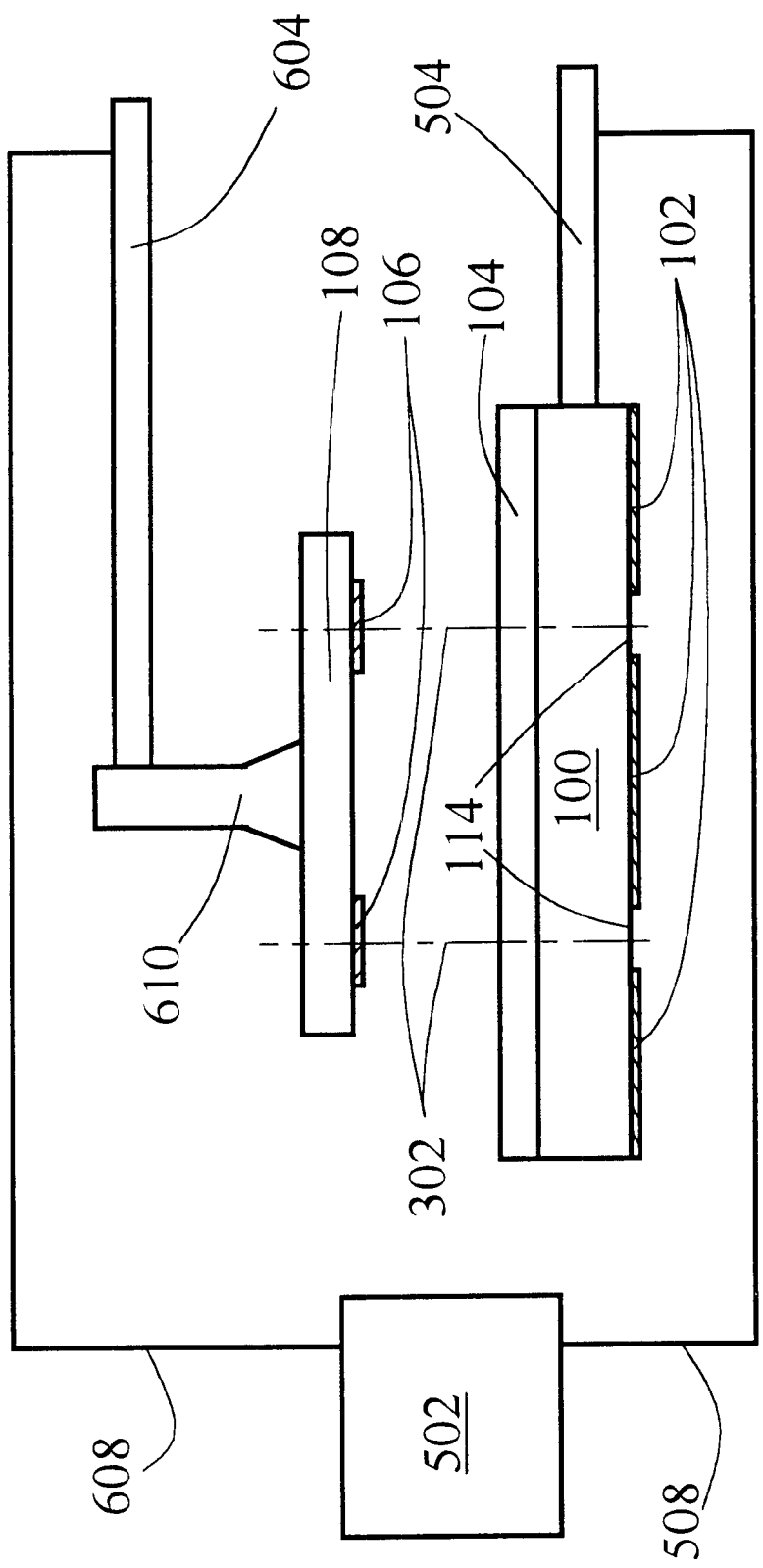
FIG. 5 is a mixed plan and schematic view showing how the die bond pads are then aligned and pressed into alignment with the via drop openings, following the processes of FIGS. 4 and 5.

Thus, as now shown in FIG. 5, control system 502 uses the information previously captured by downward-looking camera 500 and upward-looking camera 600 to actuate (i.e. move) (508, 608) die bond pads 106 into alignment with the via drop openings on flex substrate 100, using the numerically-controlled robotic motion technologies that cause actuation 508, 608. Die bond pads 106 are then pressed together with flex substrate 100 and in particular are pressed into die attach means 104 to complete the adaptive die placement. After (optional) encapsulation 111, the resulting configuration is that of FIG. 1, step 14.

This is an improvement over non-adaptive die attachment techniques wherein die are positioned relative to "fiducials" on the metal artwork pattern, stepping a certain X and Y distance from that location to where the die is supposed to be on the flex. If the stepping stage is not calibrated, or if the flex is distorted in any way, the die will be misplaced. The present invention is also an improvement over above discussed adaptive lithography techniques which correct for the misplaced die by mapping where the misplaced die bond pads are and laser drilling a via to hit that location. In adaptive lithography techniques, the metal interconnect is also adjusted to hit the via, hence each artwork is different.

The processes of forming the die-specific alignment features on the flex film by depositing and patterning metal via mask layer 102 on the bottom surface of flex substrate 100, and aligning and placing die with respect to these features, as illustrated in FIGS. 1 through 5, comprise adaptive die placement as disclosed and understood herein. It should be noted that no adaptive lithography is necessary; indeed the elimination of adaptive lithography is a useful benefit of the invention. Again, die are placed in reference to the interconnect pattern as opposed to the interconnect pattern being corrected in reference to the die placement.

In the embodiment described above in which the die alignment features consist of a continuous field of metal (via mask layer 102) with local fiducials 114 that actually double as via drop openings for die bond pads 106, a second novel and inventive process enhancement may be realized. In conventional drilling processes., vias are drilled through a flex film to the die bond pads using an Argon-ion laser at 351 nm in a serial process which is frequently time consuming, particularly for complex modules incorporating a number of high pin count devices. The step is further complicated by the necessity of aligning to and recording the position of each die, as mentioned above. By contrast, an identical module built using the above described metal field for adaptive die placement already has a conformal mask (via mask layer 102) integrated onto the bottom surface of flex substrate 100. This mask can be used to form all the vias to the die bond pads (step 15) using any of a wide variety of methods (e.g., RIE, plasma etching, excimer ablation). These are all parallel methods, so the time required to form the vias is independent of the number of vias on the module. In short, the same via mask layer 102 that enables die 108 to be placed without these placements being later compensated by adaptive lithography also provides a conformal mask which enables vias 110 to be formed using a wide range of methods—including parallel methods—that cannot otherwise be employed for this purpose.

The need for adaptive lithography subsequent to the via drilling step is dependent only on the flex distortion, since the die and vias are located with respect to the preexisting alignment pattern on the flex.

An advantage of the use of local alignment features for precision placement of the die on the flex surface is that by aligning to a conformal via mask layer 102 for the subsequent via-forming step, precise alignment of the vias to the pads is ensured 1) without requiring an additional alignment/adaptation iteration, 2) without a serial laser via-drilling operation, and (3) without depending on the flow properties of the die attach adhesive. The conformal alignment layer (via mask layer 102) disclosed herein overcomes the many prior art limitations noted earlier.

Figure 7:
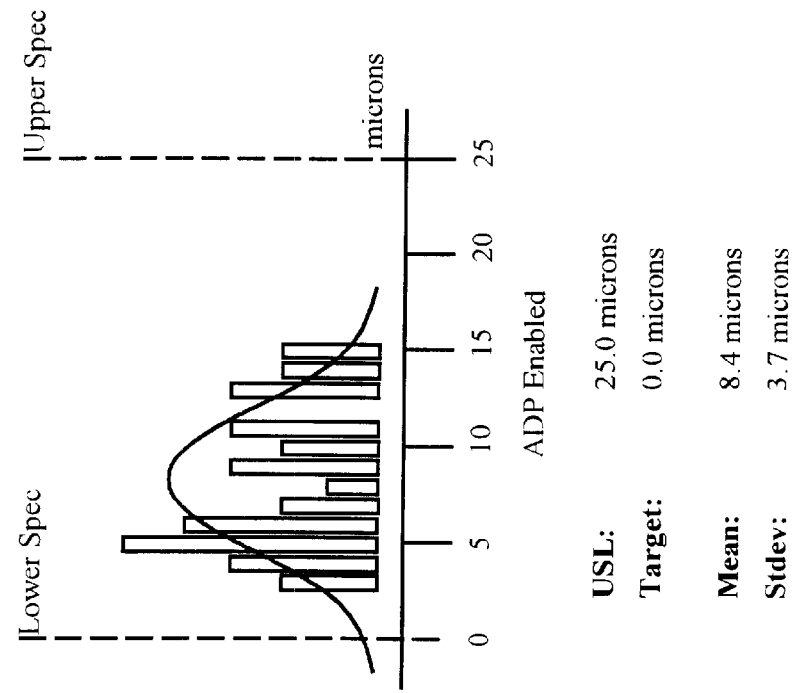
FIG. 7 is a graphical illustration of the improvement in die placement accuracy obtained by an experimental reduction to practice of the invention.
Figure 6:
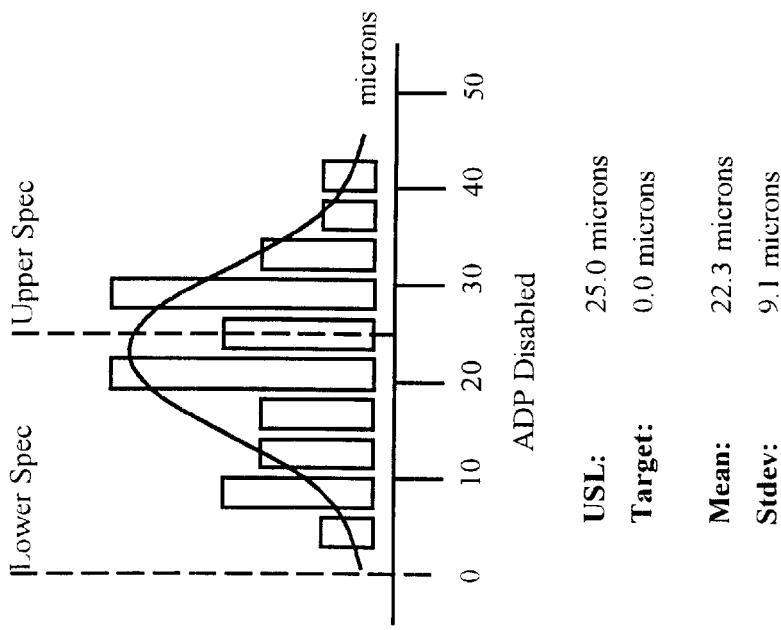
FIG. 6 is a graphical illustration of die placement accuracy obtained by prior art methods.

In an experimental reduction to practice, KAPTON® polyimide (KAPTON® is a trademark of DuPont Co.) flex (0.5 mil thick) was metallized on both sides (top layer 120 Å thick Ti/bottom layer 4.3$\mu$ thick Brite Cu), patterned, and etched. The top (die) side was patterned with an interconnect test pattern, and the upper side was patterned with via openings. After metal etching, die attach adhesive was applied. Die were then attached using adaptive die placement with alignment to the patterned metal via openings. The accuracy of the alignment is shown in FIG. 6. Adaptive dye placement can be done within a 25$\mu$ target with $Z_{st}$=5.98 $\sigma$, which significantly improves on $Z_{st}$=1.79 $\sigma$ for non-adaptive methods shown in FIG. 7.

After placement, the die attach adhesive was cured. The vias were then opened using two methods, laser excimer ablation (248 nm KrFI excimer130 mJ, 300 reps), and reactive ion etching (36 sccm $CF_4$/4 sccm $O_2$, 155 mtorr, 500 W) through the openings in the already aligned metal via mask.

The vias opened using reactive ion etching were larger than the excimer ablated vias due to lateral etching that occurred with the RIE conditions used. A more anisotropic etch is possible, which among other benefits, helps to avoid sharp via corners.

It is understood that while a preferred embodiment of the invention uses downward-looking and upward-looking cameras 500 and 600 as shown and described in relation to a particular orientation of flex substrate 100 and die 108, an inverted embodiment, or an embodiment in some other orientation, while less preferred, is still within the scope of this disclosure and its associated claims. Thus, downward-looking camera 500 generalizes to a first camera 500 which is preferably oriented downward but which may have a different orientation in other embodiments, while upward-looking camera 600 generalizes to a second camera 600 which is preferably oriented upward but also which my have a different orientation in other embodiments.

While only certain preferred features of the invention have been illustrated and described, many modifications, changes and substitutions will occur to those skilled in the art. It is, therefore, to be understood that the appended claims are intended to cover all such modifications and changes as fall within the true spirit of the invention.

What is claimed is:

1. A method for aligning die to a via mask layer on a flex substrate to produce at least one electronic chip package, comprising the steps of:

patterning a mask for via formation in said via mask layer on a bottom surface of said flex substrate; and adaptively aligning at least one bond pad of at least one said die to at least one local fiducial of said via mask layer.

2. The method of claim 1, said local fiducials comprising via drop openings.

3. The method of claim 1, comprising the further step of: attaching said at least one bond pad to a top surface of said flex substrate.

4. The method of claim 3, said local fiducials comprising via drop openings, comprising the further step of:

opening vias from said bottom surface of said flex substrate to said bond pads at said via drop openings.

5. The method of claim 4, comprising the further step of: depositing, patterning and etching interconnect metal upon said bottom surface of said flex substrate.

6. The method of claim 3, wherein attaching said at least one bond pad to said top surface of said flex substrate comprises using an adhesive.

7. The method of claim 1, said step of adaptively aligning said bond pads to said local fiducials comprising the further steps of:

locating said local fiducials using a first camera;

locating said bond pads using a second camera; and adaptively aligning said bond pads and said local fiducials with one another based upon the locations of said local fiducials located by said first camera and the locations of said bond pads located by said second camera, using a control system and actuator.

8. A method for aligning die to a via mask layer on a flex substrate to produce at least one electronic chip package, comprising the steps of:

patterning a mask for via formation in said via mask layer on a bottom surface of said flex substrate;

adaptively aligning at least one bond pad of at least one said die to at least one local fiducial of said via mask layer; and attaching said at least one bond pad to a top surface of said flex substrate.

9. The method of claim 8, said local fiducials comprising via drop openings, comprising the further step of:

opening vias from said bottom surface of said flex substrate to said bond pads at said via drop openings.

10. The method of claim 8, said step of adaptively aligning said bond pads to said local fiducials comprising the further steps of:

locating said local fiducials using a first camera;

locating said bond pads using a second camera; and adaptively aligning said bond pads and said local fiducials with one another based upon the locations of said local fiducials located by said first camera and the locations of said bond pads located by said second camera, using a control system and actuator.

11. The method of claim 8, wherein attaching said at least one bond pad to said top surface of said flex substrate comprises using an adhesive.

* * * * *